(12) United States Patent
Ghosh et al.

(10) Patent No.: US 7,604,040 B2
(45) Date of Patent: Oct. 20, 2009

(54) INTEGRATED LIQUID COOLED HEAT SINK FOR ELECTRONIC COMPONENTS

(75) Inventors: Debashis Ghosh, Amherst, NY (US); Mohinder Singh Bhatti, Amherst, NY (US)

(73) Assignee: Coolit Systems Inc., Calgary, Alberta (CA)

( * ) Notice: Subject to any disclaimer, the term of this patent is extended or adjusted under 35 U.S.C. 154(b) by 711 days.

(21) Appl. No.: 11/153,107

(22) Filed: Jun. 15, 2005

(65) Prior Publication Data
US 2006/0283579 A1  Dec. 21, 2006

(51) Int. Cl.
H05K 7/20  (2006.01)

(52) U.S. Cl. .............. 165/80.3; 165/80.4; 165/104.33; 361/699; 361/700

(58) Field of Classification Search ............ 165/104.33, 165/80.3, 80.4, 286, 104.34, 74; 361/699, 361/700, 697; 62/259.2; 257/714, 715
See application file for complete search history.

(56) References Cited

U.S. PATENT DOCUMENTS

| | | | |
|---|---|---|---|
| 2,083,611 A * | 6/1937 | Marshall ............... | 165/286 |
| 5,304,846 A | 4/1994 | Azar ..................... | 257/722 |
| 5,529,115 A * | 6/1996 | Paterson .............. | 165/104.33 |
| 6,005,772 A * | 12/1999 | Terao et al. .......... | 361/699 |
| 6,422,307 B1 | 7/2002 | Bhatti .................. | 165/185 |
| 6,702,002 B2 * | 3/2004 | Wang .................... | 165/80.3 |
| 6,808,015 B2 * | 10/2004 | Osakabe ............. | 165/104.25 |
| 7,100,677 B2 * | 9/2006 | Lee et al. ............. | 165/80.4 |

* cited by examiner

Primary Examiner—Allen J Flanigan
(74) Attorney, Agent, or Firm—Arent Fox LLP

(57) ABSTRACT

A fluid heat exchanger unit cools an electronic device with a cooling fluid supplied to an upper portion of a cooling housing. A refrigerant is disposed in a lower portion of the cooling housing for liquid-to-vapor transformation. A partition divides the upper portion of the cooling housing from the lower portion. A heat rejecter is disposed on and above the upper wall of the cooling housing with a first header extending from and in fluid communication with the liquid coolant outlet. A second header extends upwardly from a rejecter outlet. A plurality of first tubes extend between and in fluid communication with the first header and the second header with a plurality of first air fins disposed between the upper wall and the first tubes. A single unit defines both the cooling housing and the air cooled heat rejecter to thereby allow the manufacture of the unit in a single process with the attendant reduction in shipping, handling and installation.

14 Claims, 5 Drawing Sheets

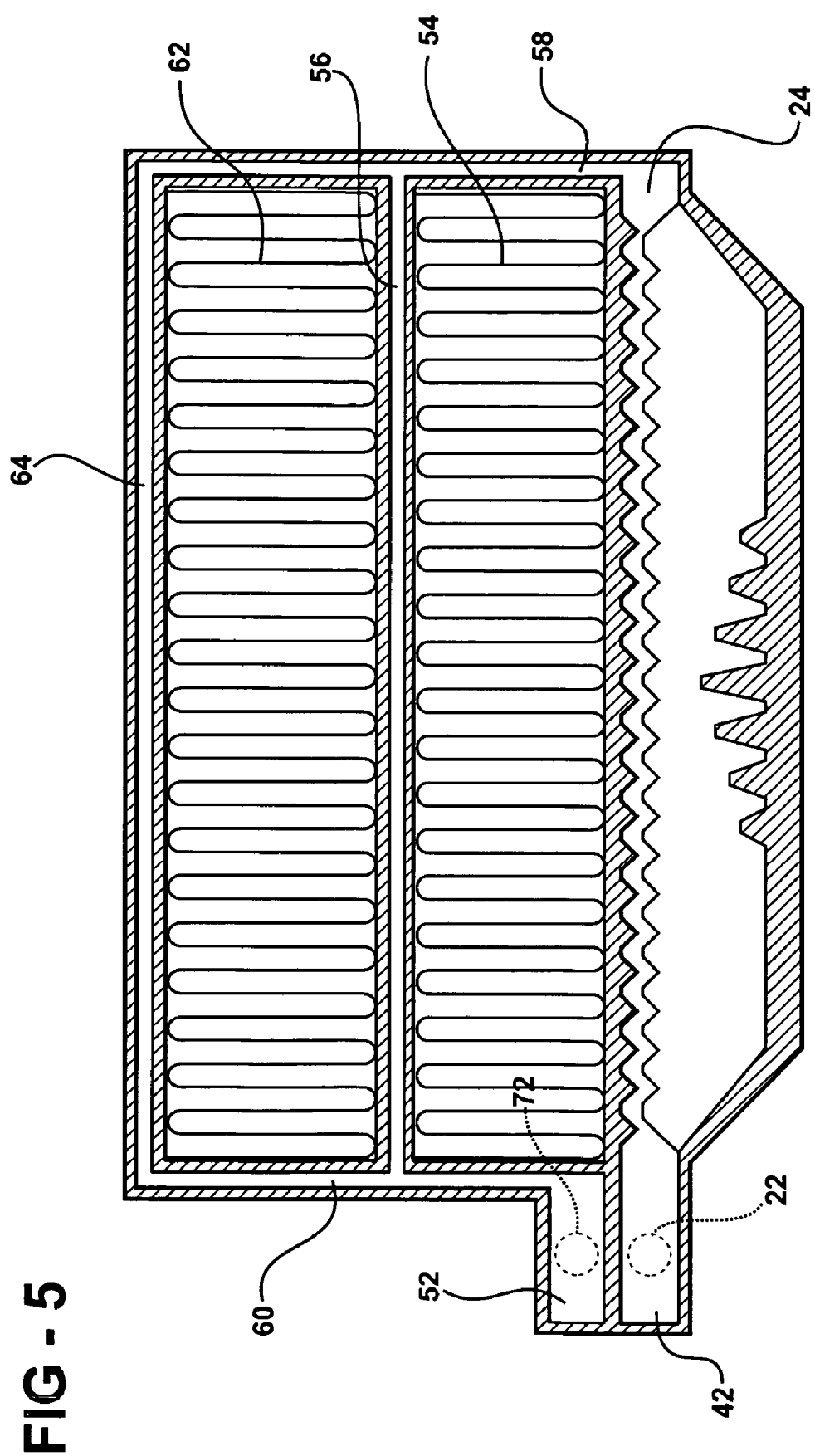

INTEGRATED LIQUID COOLED HEAT SINK FOR ELECTRONIC COMPONENTS

RELATED APPLICATIONS

The subject invention has widespread utility as illustrated in the co-pending application Ser. No. 11/040,989; Ser. No. 11/040,321 and Ser. No. 11/040,988, all filed on Jan. 21, 2005.

BACKGROUND OF THE INVENTION

1. Field of the Invention

A fluid heat exchanger unit for cooling an electronic device.

2. Description of the Prior Art

Research activities have focused on developing assemblies to efficiently dissipate heat from electronic devices that are highly concentrated heat sources, such as microprocessors and computer chips. These electronic devices typically have power densities in the range of about 5 to 35 W/cm$^2$ and relatively small available space for placement of fans, heat exchangers, heat sink assemblies and the like. However, these electronic devices are increasingly being miniaturized and designed to achieve increased computing speeds that generate heat up to 200 W/cm$^2$.

Heat exchangers and heat sink assemblies have been used that apply natural or forced convection cooling methods to cool the electronic devices. These heat exchangers typically use air to directly remove heat from the electronic devices. However, air has a relatively low heat capacity. Such heat sink assemblies are suitable for removing heat from relatively low power heat sources with power density in the range of 5 to 15 W/cm$^2$. The increased computing speeds result in corresponding increases in the power density of the electronic devices in the order of 20 to 35 W/cm$^2$ thus requiring more effective heat sink assemblies.

In response to the increased heat to be dissipated, liquid-cooled units called LCUs employing a cold plate in conjunction with high heat capacity fluids, like water and water-glycol solutions, have been used to remove heat from these types of high power density heat sources. One type of LCU circulates the cooling liquid so that the liquid removes heat from the heat source, like a computer chip, affixed to the cold plate, and is then transferred to a remote location where the heat is easily dissipated into a flowing air stream with the use of a liquid-to-air heat exchanger and an air moving device such as a fan or a blower. These types of LCUs are characterized as indirect cooling units since they remove heat from the heat source indirectly by a secondary working fluid, generally a single-phase liquid, which first removes heat from the heat source and then dissipates it into the air stream flowing through the remotely located liquid-to-air heat exchanger. Such LCUs are satisfactory for moderate heat flux less than 35 to 45 W/cm$^2$ at the cold plate.

In the prior art heat sinks, such as those disclosed in U.S. Pat. Nos. 6,422,307 and 5,304,846, the single-phase working fluid of the liquid cooled unit (LCU) flows directly over the cold plate causing cold plate corrosion and leakage problems.

As computing speeds continue to increase even more dramatically, the corresponding power densities of the devices rise up to 200 W/cm$^2$. The constraints of the miniaturization coupled with high heat flux generated by such devices call for extremely efficient, compact, and reliable thermosiphon cooling units called TCUs. Such TCUs perform better than LCUs above 45 W/cm$^2$ heat flux at the cold plate. A typical TCU absorbs heat generated by the electronic device by vaporizing the captive working fluid on a boiler plate of the unit. The boiling of the working fluid constitutes a phase change from liquid-to-vapor state and as such the working fluid of the TCU is considered to be a two-phase fluid. The vapor generated during boiling of the working fluid is then transferred to an air-cooled condenser, in close proximity to the boiler plate, where it is liquefied by the process of film condensation over the condensing surface of the TCU. The heat is rejected into an air stream flowing over a finned external surface of the condenser. The condensed liquid is returned back to the boiler plate by gravity to continue the boiling-condensing cycle.

The aforementioned co-pending applications disclose a cooling housing with a partition dividing the cooling housing into a upper portion having an upper wall, with a liquid coolant inlet for receiving liquid coolant from the system and a liquid coolant outlet, and a lower portion. The upper portion defines a coolant passage between the partition and the upper wall for liquid coolant flow from the liquid coolant inlet to the liquid coolant outlet. A refrigerant is disposed in the lower portion of the cooling housing for liquid-to-vapor transformation. An electronic device generates an amount of heat to be dissipated and the heat is transferred from the electronic device to the bottom of the heat exchanger cooling housing. The heat is then conducted from the bottom to the refrigerant in the lower portion. A working fluid mover, such as a pump, moves a coolant liquid through a cooling fluid storage vessel that stores excess coolant. The pump moves the cooling fluid through a heat extractor or radiator to dissipate heat from the coolant. However, in that system the radiator is separate and spaced remotely from the cooling housing, to thereby require separate manufacturing, shipping, handling and installation.

SUMMARY OF THE INVENTION AND ADVANTAGES

In accordance with the subject invention, heat generated by an electronic device is also transferred to the lower portion of such a cooling housing having a refrigerant therein for liquid-to-vapor transformation as liquid coolant flows above a partition defining a coolant passage in the upper portion of the cooling housing. In addition, a heat rejecter is disposed on and above the upper wall of the cooling housing with a rejecter inlet adjacent and in fluid communication with the liquid coolant outlet of the cooling housing and a rejecter outlet adjacent the liquid coolant inlet of the cooling housing for returning liquid coolant to the system.

The present invention utilizes a single unit to define both the cooling housing and the air cooled heat rejecter to thereby allow the manufacture of the unit in a single process with the attendant reduction in shipping, handling and installation.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 5 is another embodiment of the unit of the subject invention.

DETAILED DESCRIPTION OF THE PREFERRED EMBODIMENT

Figure 1:
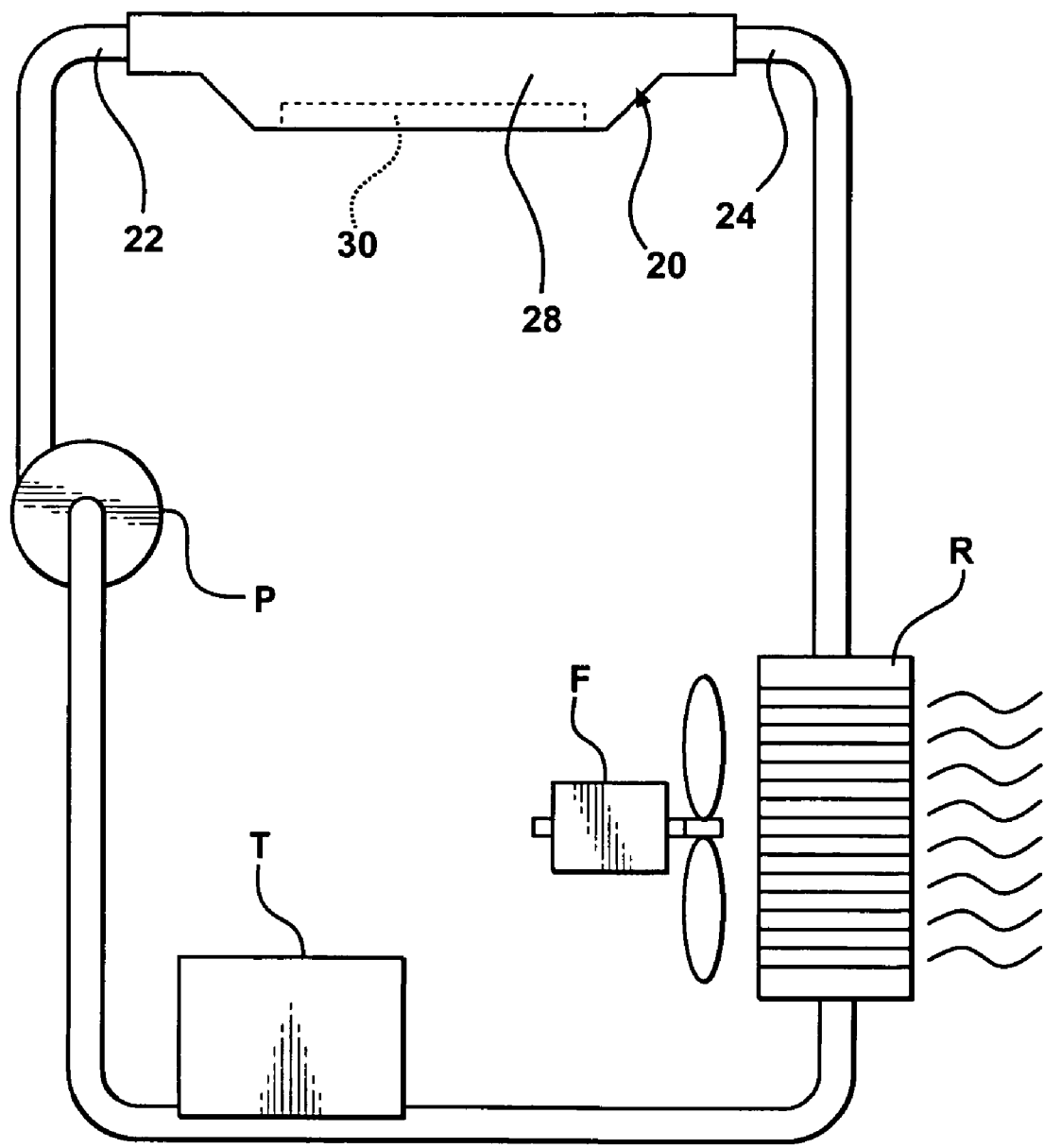
FIG. 1 is schematic view of the system with the cooling housing and the air cooled radiator being completely separate.
Figure 2:
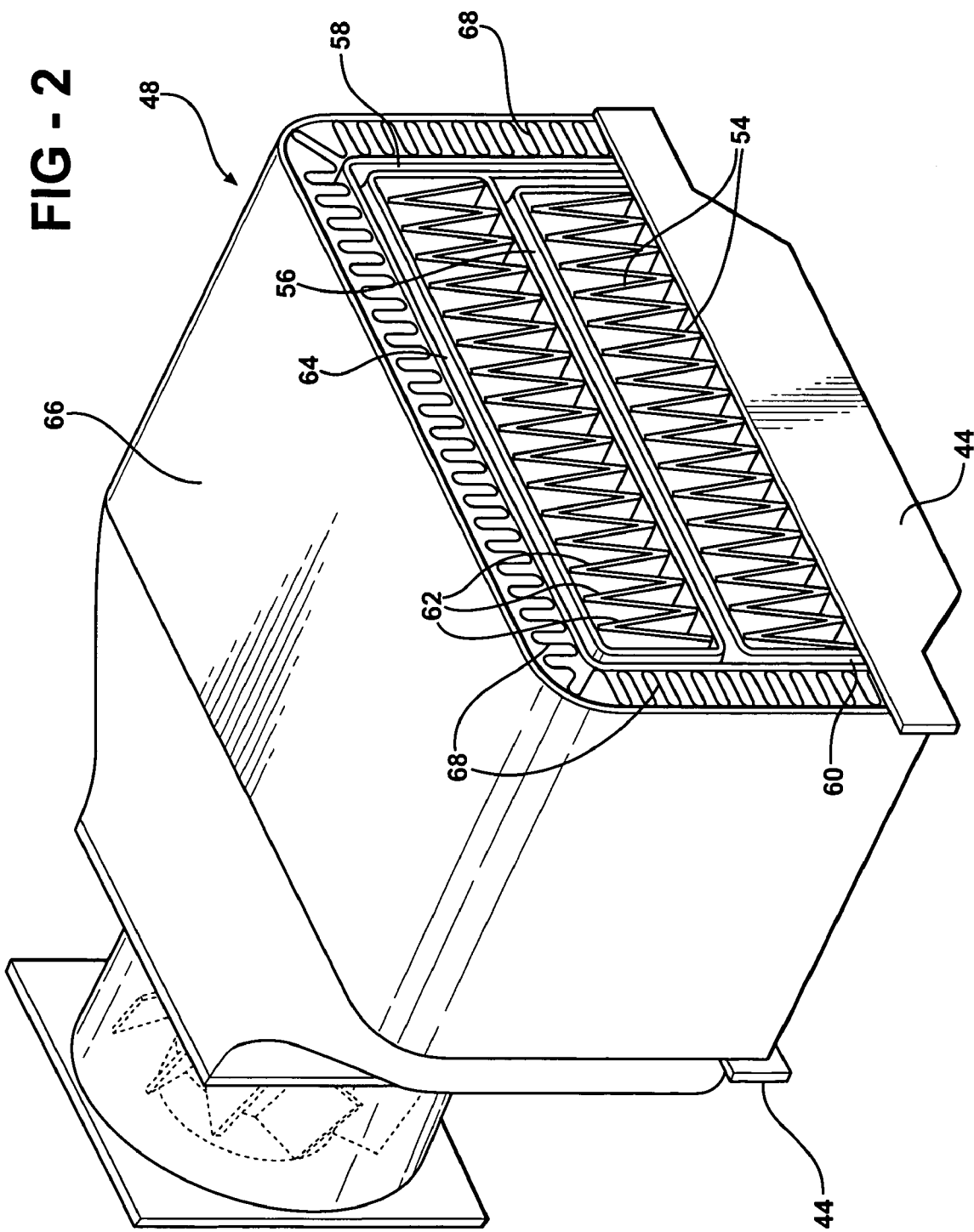
FIG. 2 is perspective view of the unit of the subject invention.
Figure 3:
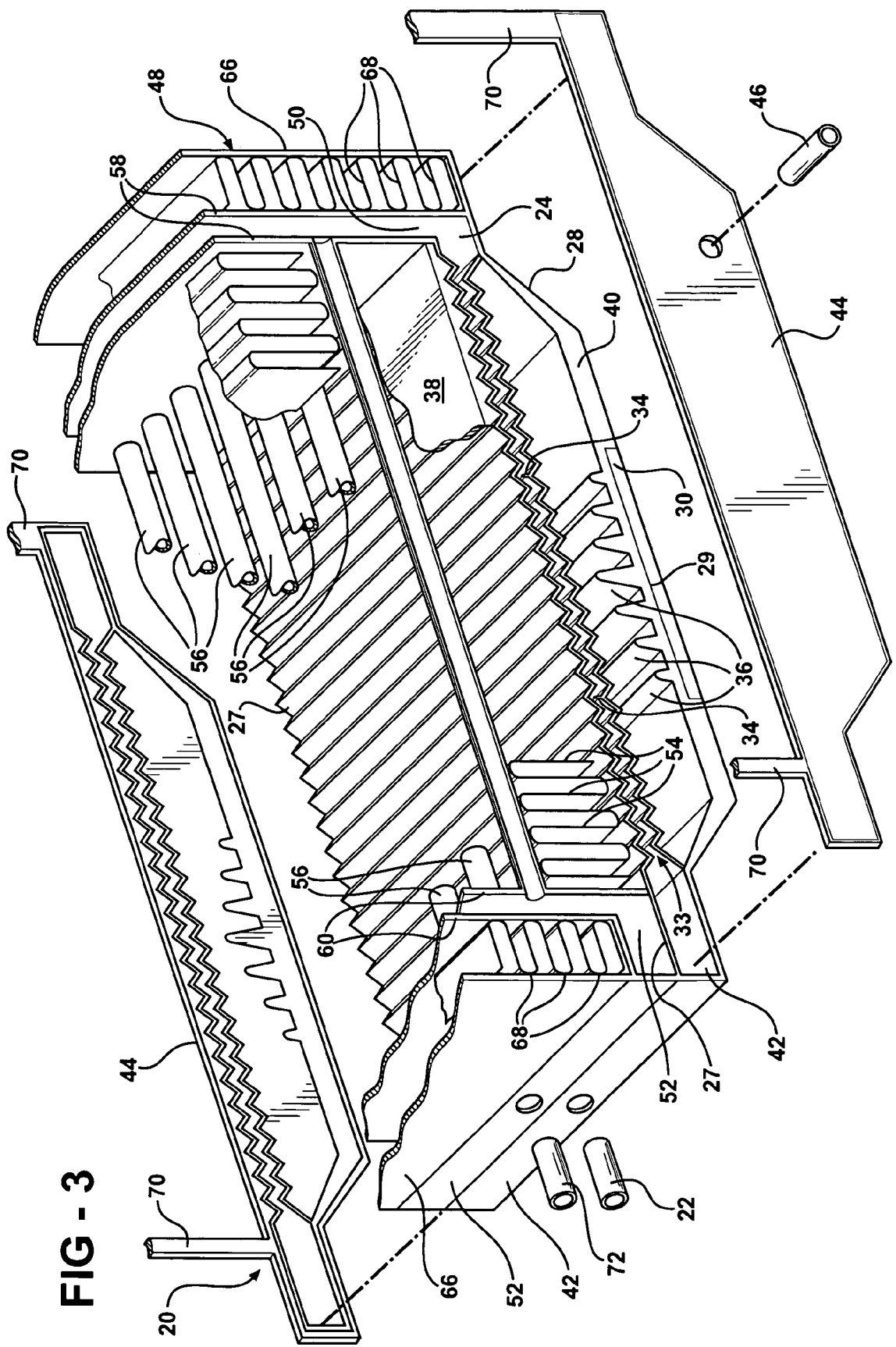
FIG. 3 is an exploded perspective view, partially cut away.

As alluded to above, the fluid heat exchanger unit of the subject invention incorporates a cooling housing 20 of the type disclosed in the aforementioned co-pending patent applications. The cooling housing 20 includes a liquid coolant inlet 22 and a liquid coolant outlet 24 and an upper portion 26 defining a top or upper wall 27 and a lower portion 28 extending between the liquid coolant inlet 22 and the liquid coolant outlet 24 for establishing a direction of flow from the liquid coolant inlet 22 to the liquid coolant outlet 24. The cooling housing 20 is used to cool an electronic device 30 engaging or secured to the lower portion 28 of the cooling housing 20. The electronic device 30 or component is preferably adhesively secured in a recess 29 in the bottom 40 of the cooling housing 20.

A partition 32 divides the cooling housing 20 into the upper portion 26 and the lower portion 28 for establishing a direction of flow of liquid coolant in a coolant passage 33 defined between the upper wall 27 and the partition 32 from the liquid coolant inlet 22 to the liquid coolant outlet 24 in the upper portion 26. The cooling housing 20 is hermetically sealed about the partition 32 to contain a refrigerant in the lower portion 28 for liquid-to-vapor transformation. In other words, the partition 32 separates the refrigerant in the lower portion 28 from the liquid coolant in the coolant passage 33 of the upper portion 26.

The partition 32 and the upper wall 27 are undulated or corrugated transversely to the direction of flow from the liquid coolant inlet 22 to the liquid coolant outlet 24 to define the flow passage. The partition 32 defines a lower wall of the coolant passage 33 in the upper portion 26 and the upper wall 27 of the upper portion 26 defines a top of the coolant passage 33, which top or upper wall 27 is also undulated transversely to the direction of flow from the liquid coolant inlet 22 to the liquid coolant outlet 24 to define the coolant passage 33. Disposed inside the coolant passage 33 are the flow interrupters 34 extending vertically upward into the coolant stream. The purpose of the flow interrupters 34 is to interrupt the thermal boundary layer growing from the upper corrugated wall and the lower corrugated wall of the coolant passage 33. The interruption of the thermal boundary layer causes the heat transfer coefficient to attain a higher value at the point of interruption.

A plurality of fins 36 extend from the bottom 40 of the cooling housing 20 for increasing heat transfer from the electronic device 30 to the interior of the lower portion 28 of the cooling housing 20. The fins 36 extend linearly across the direction of flow under the partition 32 and between the liquid coolant inlet 22 and the liquid coolant outlet 24 in the upper portion 26. The heat transfer fins 36 are disposed in the lower portion 28 of the cooling housing 20 for transferring heat from the electronic device 30 disposed on the exterior of the lower portion 28 of the cooling housing 20. The fins 36 vary in height and, more specifically, the fins 36 are of the greatest height midway between the liquid coolant inlet 22 and the liquid coolant outlet 24 and are of progressively lesser height from the midpoint toward the liquid coolant inlet 22 and the liquid coolant outlet 24 respectively. The middle fin 36 may extend all the way to the lower corrugated wall and be brazed to it to provide reinforcement to the vapor chamber below the lower corrugated wall.

The upper portion 26 of the cooling housing 20 presents a generally rectangular footprint and the lower portion 28 of the cooling housing 20 is coextensive with the upper portion 26. The entire cooling housing 20, including the flow passage with upper corrugated wall and lower corrugated wall along with end sections, and the pan-shaped lower portion 28 having integrally formed therewith the fins 36 and the recess 29 for the electronic device 30, may be extruded as a single or integral piece thereby obviating the need for various brazing operations. Sections of the extrusion are cut and end sheets with braze coating are stamped out of sheet stock and bonded to the edges of the extruded sections, thereby hermetically sealing the upper portion 26 and lower portions 28 of the cooling housing 20.

In addition, the spaces between the undulations of the upper wall 27 may be filled in with the metal material of the upper wall 27 or filler material 38 for providing a flat surface for banding to the first fins 54.

The upper portion 26 of the housing 20 is generally rectangular and the lower portion 28 of the housing 20 is generally rectangular and generally coextensive with the upper portion 26. A recess 29 extends into the lower portion 28 of the housing 20 for receiving the electronic device 30. The entire housing 20, including the flow passage with upper corrugated wall and lower corrugated wall along with end sections defining a gallery 42 or tank 42, and the pan-shaped lower portion 28 having integrally formed therewith the fins 36 and the recess 29 for the electronic device 30, may be extruded as a single or integral piece thereby obviating the need for various brazing operations. Sections of the extrusion are cut and end plates 44 with braze coating are stamped out of sheet stock. During the stamping of the end plates 44, various grooves are formed in the end plates 44 to receive and facilitate bonding to the edges of the extruded sections, thereby hermetically sealing the upper portion 26 and lower portions 28 of the housing 20. A simple machining operation is used to drill holes in one end plate 44 and in the gallery 42 or tank 42 that feeds the coolant passage 33. A refrigerant charge tube 46 is welded to the hole drilled in the end plate 44, and the tubular coolant is welded to the gallery 42 or tank 42.

The liquid cooling system illustrated in FIG. 1 incorporates the heat exchanger cooling housing 20 for cooling an electronic device 30. As alluded to above, a working fluid mover, such as a pump P, moves a cooling fluid, usually a liquid, through a cooling fluid storage vessel T, that stores excess cooling fluid. The pump P moves the cooling fluid through a heat extractor or radiator unit to dissipate heat from the cooling fluid, the heat extractor or radiator unit including a fan F and radiator R. The radiator R is separate and spaced from the cooling housing 20.

In accordance with the subject invention, a heat rejecter 48 is integrally fabricated with the cooling housing 20 whereby liquid coolant flows directly out of the coolant outlet 24 of the cooling housing 20 and into an air cooled heat rejecter 48. The heat rejecter 48 is disposed on and above the upper wall 27 of the cooling housing 20 with a rejecter inlet 50 adjacent and in fluid communication with the liquid coolant outlet 24 and a gallery 42 or a rejecter outlet 52 adjacent the liquid coolant inlet 22 for returning liquid coolant to the system.

Figure 4:
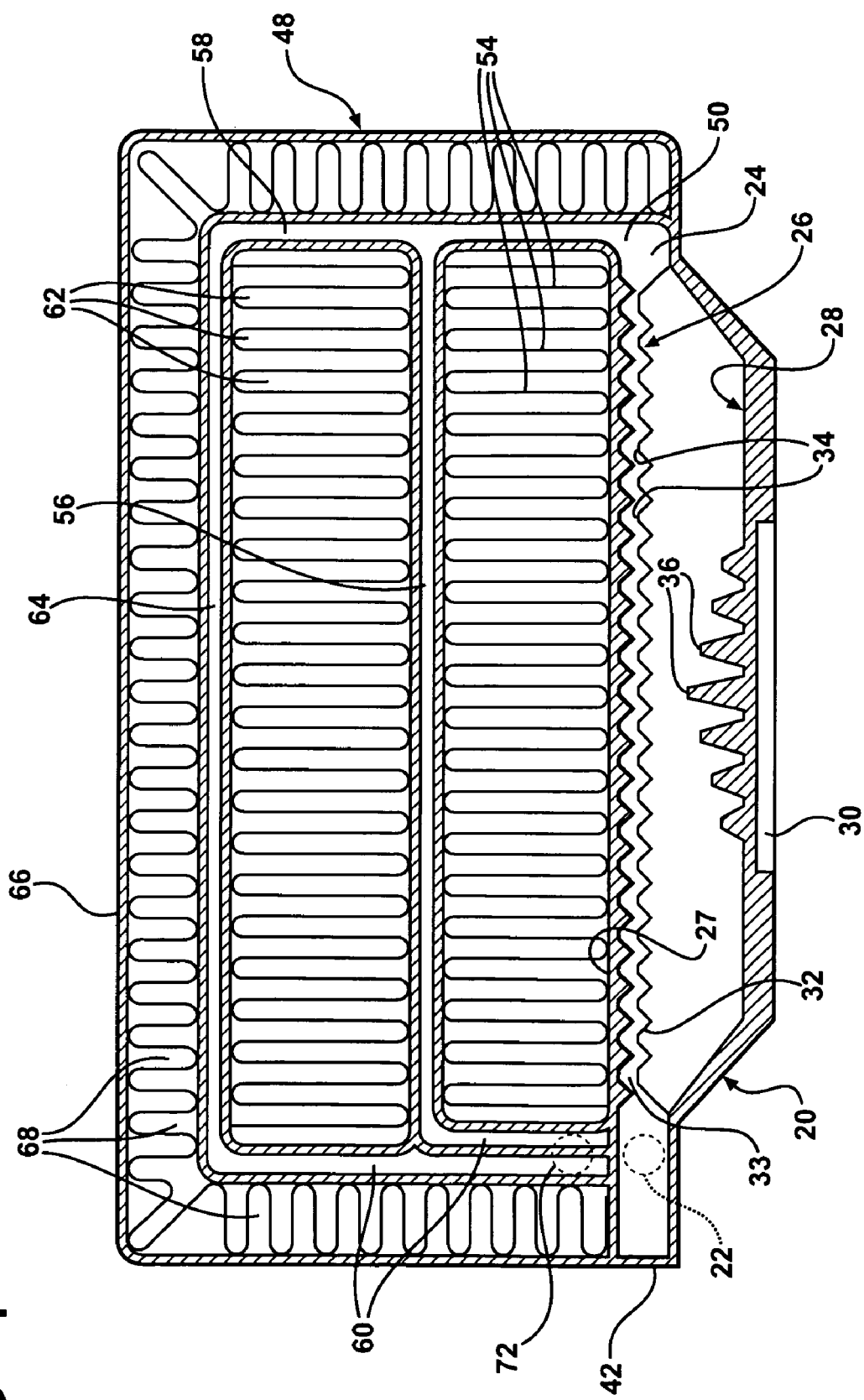
FIG. 4 is a cross sectional view of the unit shown in FIG. 2.

The heat rejecter 48 includes at least one layer of first air fins 54 and at least one layer of first tubes 56 for conducting liquid coolant from the rejecter inlet 50 to the rejecter outlet 52 for transferring heat from the first tubes 56 to the first air fins 54. The plurality of first air fins 54 are disposed along the filler material 38 and upper wall 27 to extend between the rejecter inlet 50 and the rejecter outlet 52. To facilitate the first tubes 56, the heat rejecter 48 includes a first header 58 extending from the rejecter inlet 50 in a direction transverse to the upper wall 27 and a second header 60 extending from the rejecter outlet 52 in a direction transverse to the upper wall 27. The first header 58 is defined by a pair of parallel and spaced walls formed integrally with the upper wall 27 of the cooling housing 20 and the bottom 40 wall of the lower portion 26, 28 and/or the partition 32. Likewise, the second header 60 is defined by a pair of parallel and spaced walls extending upwardly from the rejecter outlet 52 or gallery 42. Although there are normally a plurality of laterally spaced first tubes 56, at least one first tube 56 extends between and in fluid communication with the first header 58 and the second header 60 with the first air fins 54 disposed between the upper wall 27 and the first tube 56 or first tubes 56. As illustrated in FIGS. 4 and 5, the rejecter would frequently include a plurality of second air fins 62 disposed above the first tube 56 and at least one second tube 64 is disposed above the second air fins 62 and extends between and in fluid communication with the first header 58 and the second header 60.

The heat rejecter 48 includes a tunnel-shaped casing 66 extending from the liquid coolant inlet 22 upwardly with the second header 60 and across the unit and downwardly with the first header 58 to the liquid coolant outlet 24. The casing 66 and the first air fins 54 and the second air fins 62 extend parallel to one another for air to pass through the casing 66 and the first air fins 54 and the second air fins 62 in a direction transverse to the first tubes 56 and the second tubes 64. The casing 66 is an inverted U-shape with the legs secured to the cooling housing 20. A plurality of third air fins 68 are disposed between and parallel to the casing 66 and the first header 58 and are disposed between and parallel to the casing 66 and the second header 60 and extend across the unit between the first header 58 and the second header 60. In other words, the third air fins 68 extend through the same U-shaped path of the casing 66.

Although as shown, the second header 60 includes a separate passage for each of the first tube 56 and the second tube 64, either one of the first header 58 and the second header 60 may include a separate passage for each of the first tube 56 and the second tube 64, as illustrated in FIG. 4.

The end plates 44 include header plates 70 integral with the end plates 44 and extending upwardly to close and seal the open sides of the first header 58 and the second header 60. All of the components may be made of metal and wired together and placed in a brazing furnace.

The liquid coolant inlet 22 to the cooling housing 20 is disposed above the rejecter outlet 52. The liquid coolant inlet 22 to the cooling housing 20 feeds an inlet gallery 42 and is defined by a tubular liquid coolant inlet 22. A tubular outlet 72 empties the rejecter outlet 52. Both tubular members are also brazed into position in spaced and parallel relationship to one another. The rejecter outlet 52 defines an outlet gallery 42 joined to the inlet gallery 42, as by sharing a common wall.

The electronic device 30 generates heat that is transferred through the fins 36 to the captive refrigerant sealed in the lower portion 28 of the cooling housing 20 to boil and vaporize the refrigerant. The vaporized refrigerant rises in the lower portion 28 of the cooling housing 20 and into the V-shaped cavities between the crests of the coolant flow passage. The liquid coolant flowing through the undulating coolant passage 33 absorbs heat from the refrigerant vapor thereby condensing the vapor back into liquid refrigerant pooled in the lower portion 28 where it again absorbs heat from the electronic device 30 to repeat the cycle. At the same time, liquid coolant exits the cooling housing 20 and immediately into the first header 58 for distribution to the first tubes 56, and likely second tubes 64, whereby the liquid coolant is further cooled by heat transfer with the fist fins 36, and likely the second fins 36. The liquid coolant then flows into the rejecter outlet 52 gallery 42 for return to the system. The third fins 36 further enhance the heat transfer, particularly with the first header 58 and the second header 60.

Obviously, many modifications and variations of the present invention are possible in light of the above teachings. The invention may be practiced otherwise than as specifically described within the scope of the appended claims, wherein recitations should be interpreted to cover any combination in which the incentive novelty exercises its utility.

What is claimed is:

1. A fluid heat exchanger unit for cooling an electronic device and comprising;
   a cooling housing having a liquid coolant inlet for receiving liquid coolant from the system and a liquid coolant outlet and an upper portion and a lower portion with said liquid coolant inlet and said liquid coolant outlet being in said upper portion,
   a partition dividing said cooling housing into said upper portion, with said upper portion having an upper wall, and said lower portion for establishing a direction of liquid coolant flow in a coolant passage from said liquid coolant inlet to said liquid coolant outlet in said upper portion between said partition and said upper wall,
   a refrigerant disposed in said lower portion of said cooling housing for liquid-to-vapor transformation,
   said cooling housing being hermetically sealed about said partition to separate said refrigerant in said lower portion from the liquid coolant in said upper portion, and
   a heat rejecter disposed on and above said upper wall of said cooling housing with a rejecter inlet adjacent and in fluid communication with said liquid coolant outlet and a rejecter outlet adjacent said liquid coolant inlet for returning liquid coolant to the system,
   wherein said upper wall of said cooling housing includes a filler material for providing a common wall with a flat surface for integration of said heat rejecter, and
   wherein said heat rejecter includes at least one layer of first air fins and at least one layer of first tubes for conducting liquid coolant from said rejecter inlet to said rejecter for transferring heat from said first tubes to said first air fins.

2. A fluid heat exchanger unit for cooling an electronic device and comprising;
   a cooling housing having a liquid coolant inlet for receiving liquid coolant from the system and a liquid coolant outlet and an upper portion and a lower portion with said liquid coolant inlet and said liquid coolant outlet being in said upper portion,
   a partition dividing said cooling housing into said upper portion, with said upper portion having an upper wall, and said lower portion for establishing a direction of liquid coolant flow in a coolant passage from said liquid coolant inlet to said liquid coolant outlet in said upper portion between said partition and said upper wall,
   a refrigerant disposed in said lower portion of said cooling housing for liquid-to-vapor transformation,
   said cooling housing being hermetically sealed about said partition to separate said refrigerant in said lower portion from the liquid coolant in said upper portion, and
   a heat rejecter disposed on and above said upper wall of said cooling housing with a rejecter inlet adjacent and in fluid communication with said liquid coolant outlet and a rejecter outlet adjacent said liquid coolant inlet for returning liquid coolant to the system,
   wherein said upper wall of said cooling housing includes a filler material for providing a common wall with a flat surface for integration of said heat rejecter, wherein said heat rejecter includes a plurality of first air fins disposed along said upper wall between said rejecter inlet and said rejecter outlet, and wherein said heat rejecter includes a first header extending from said rejecter inlet in a direction transverse to said upper wall and a second header extending from said rejecter outlet in a direction transverse to said upper wall and including at least one first tube extending between and in fluid communication with said first header and said second header with said first air fins disposed between said upper wall and said first tube.

3. The unit as set forth in claim 2 wherein said rejecter includes a plurality of second air fins disposed above said first tube and at least one second tube disposed above said second air fins and extending between and in fluid communication with said first header and said second header.

4. The unit as set forth in claim 3 wherein one of said first header and said second header includes a separate passage for each of said first tube and said second tube.

5. A fluid heat exchanger unit for cooling an electronic device and comprising;
a cooling housing having a liquid coolant inlet for receiving liquid coolant from the system and a liquid coolant outlet and an upper portion and a lower portion with said liquid coolant inlet and said liquid coolant outlet being in said upper portion,
a partition dividing said cooling housing into said upper portion, with said upper portion having an upper wall, and said lower portion for establishing a direction of liquid coolant flow in a coolant passage from said liquid coolant inlet to said liquid coolant outlet in said upper portion between said partition and said upper wall,
a refrigerant disposed in said lower portion of said cooling housing for liquid-to-vapor transformation,
said cooling housing being hermetically sealed about said partition to separate said refrigerant in said lower portion from the liquid coolant in said upper portion, and
a heat rejecter disposed on and above said upper wall of said cooling housing with a rejecter inlet adjacent and in fluid communication with said liquid coolant outlet and a rejecter outlet adjacent said liquid coolant inlet for returning liquid coolant to the system;
wherein said heat rejecter includes a plurality of first air fins disposed along said upper wall between said rejecter inlet and said rejecter outlet;
wherein said heat rejecter includes a first header extending from said rejecter inlet in a direction transverse to said upper wall and a second header extending from said rejecter outlet in a direction transverse to said upper wall and including at least one first tube extending between and in fluid communication with said first header and said second header with said first air fins disposed between said upper wall and said first tube; and
wherein said rejecter includes a tunnel-shaped casing extending from said liquid coolant inlet upwardlly with said second header and across said unit and downwardly with said first header to said liquid coolant outlet.

6. The unit as set forth in claim 5 wherein said casing and said first air fins extend parallel to one another for air to pass through said casing and said first air fins in a direction transverse to said first tubes.

7. The unit as set forth in claim 6 wherein said rejecter includes a plurality of third air fins disposed between and parallel to said casing and said first header and disposed between and parallel to said casing and said second header and extending between said first header and said second header.

8. The unit as set forth in claim 5 wherein said liquid coolant inlet to said cooling housing is disposed below said rejecter outlet.

9. A fluid heat exchanger unit for cooling an electronic device and comprising;
a cooling housing having a liquid coolant inlet for receiving liquid coolant from the system and a liquid coolant outlet and an upper portion and a lower portion with said liquid coolant inlet and said liquid coolant outlet being in said upper portion,
a partition dividing said cooling housing into said upper portion, with said upper portion having an upper wall, and said lower portion for establishing a direction of liquid coolant flow in a coolant passage from said liquid coolant inlet to said liquid coolant outlet in said upper portion between said partition and said upper wall,
a refrigerant disposed in said lower portion of said cooling housing for liquid-to-vapor transformation,
said cooling housing being hermetically sealed about said partition to separate said refrigerant in said lower portion from the liquid coolant in said upper portion, and
a heat rejecter disposed on and above said upper wall of said cooling housing with a rejecter inlet adjacent and in fluid communication with said liquid coolant outlet and a rejecter outlet adjacent said liquid coolant inlet for returning liquid coolant to the system;
wherein said heat rejecter includes a plurality of first air fins disposed along said upper wall between said rejecter inlet and said rejecter outlet;
wherein said heat rejecter includes a first header extending from said rejecter inlet in a direction transverse to said upper wall and a second header extending from said rejecter outlet in a direction transverse to said upper wall and including at least one first tube extending between and in fluid communication with said first header and said second header with said first air fins disposed between said upper wall and said first tube; and
wherein said liquid coolant inlet to said cooling housing feeds an inlet gallery and is defined by a tubular member and said rejecter outlet includes a tubular outlet parallel to said tubular member.

10. The unit as set forth in claim 9 wherein said partition is undulated transversely to said direction of flow from said liquid coolant inlet to said liquid coolant outlet.

11. The unit as set forth in claim 10 wherein said partition defines a bottom of said coolant passage in said upper portion and said upper wall defines the top of said coolant passage, said upper wall also being undulated transversely to said direction of flow from said liquid coolant inlet to said liquid coolant outlet.

12. The unit as set forth in claim 11 including heat transfer fins disposed in said lower portion of said cooling housing for transferring heat from an electronic device disposed on the exterior of said lower portion of said cooling housing.

13. The unit as set forth in claim 9 including a recess in said lower portion for receiving the electronic device.

14. The unit as set forth in claim 9 wherein said upper portion of said cooling housing presents a generally rectangular footprint and said lower portion of said cooling housing is generally coextensive with said upper portion, and said heat rejecter presents the same footprint.

* * * * *